(12) United States Patent
Uzoh et al.

(10) Patent No.: US 6,695,962 B2
(45) Date of Patent: Feb. 24, 2004

(54) ANODE DESIGNS FOR PLANAR METAL DEPOSITS WITH ENHANCED ELECTROLYTE SOLUTION BLENDING AND PROCESS OF SUPPLYING ELECTROLYTE SOLUTION USING SUCH DESIGNS

(75) Inventors: Cyprian E. Uzoh, Milpitas, CA (US); Homayoun Talieh, San Jose, CA (US); Bulent M. Basol, Manhattan Beach, CA (US)

(73) Assignee: NuTool Inc., Milpitas, CA (US)

( * ) Notice: Subject to any disclaimer, the term of this patent is extended or adjusted under 35 U.S.C. 154(b) by 0 days.

(21) Appl. No.: 09/845,262

(22) Filed: May 1, 2001

(65) Prior Publication Data
US 2002/0162750 A1 Nov. 7, 2002

(51) Int. Cl.⁷ .......................... C25D 5/00; C25D 11/32; C25D 17/00; B05C 11/00
(52) U.S. Cl. ...................... 205/148; 205/157; 205/640; 204/264; 204/266; 204/276; 204/292; 118/610; 118/612
(58) Field of Search ................. 204/264, 276, 204/282, 224, 266, 292; 205/148, 157, 640; 427/430.1; 118/429, 610, 612

(56) References Cited

U.S. PATENT DOCUMENTS

| | | | |
|---|---|---|---|
| 3,328,273 A | | 6/1967 | Creutz et al. |
| 4,258,316 A | * | 3/1981 | Leif ........................ 324/71 CP |
| 4,430,173 A | | 2/1984 | Boudot et al. |
| 4,948,474 A | | 8/1990 | Miljkovic |
| 4,954,142 A | | 9/1990 | Carr et al. |
| 4,975,159 A | | 12/1990 | Dahms |
| 5,084,071 A | | 1/1992 | Nenadic et al. |
| 5,256,565 A | | 10/1993 | Bernhardt et al. |
| 5,354,490 A | | 10/1994 | Yu et al. |
| 5,516,412 A | | 5/1996 | Andricacos et al. |
| 5,681,215 A | | 10/1997 | Sherwood et al. |
| 5,683,564 A | * | 11/1997 | Reynolds ................. 204/212 X |

(List continued on next page.)

FOREIGN PATENT DOCUMENTS

| | | |
|---|---|---|
| WO | WO 98/27585 | 6/1998 |
| WO | WO 00/26443 | 5/2000 |

OTHER PUBLICATIONS

Joseph M. Steigerwald et al., "Chemical Mechanical Planarization of Microelectronic Materials", A Wiley–Interscience Publication, 1997, by John Wiley & Sons, Inc. pp. 212–222, no month.

(List continued on next page.)

Primary Examiner—Donald R. Valentine
(74) Attorney, Agent, or Firm—Crowell & Moring LLP

(57) ABSTRACT

An anode assembly by which a solution can be supplied to a surface of a semiconductor substrate includes a housing defining an internal housing volume into which the solution can flow. A closure is provided for the internal housing volume, and the solution can be discharged from the internal housing volume through the closure towards the surface of the semiconductor substrate. A filter divides the internal housing volume into a first chamber and a second chamber located between the first chamber and the closure. During supply of the solution to the surface, a flow of the solution into the second chamber occurs at a higher rate than a flow of the solution into the first chamber, and the flows are blended in the second chamber.

32 Claims, 3 Drawing Sheets

U.S. PATENT DOCUMENTS

| | | |
|---|---|---|
| 5,755,859 A | 5/1998 | Brusic et al. |
| 5,762,544 A | 6/1998 | Zuniga et al. |
| 5,770,095 A | 6/1998 | Sasaki et al. |
| 5,773,364 A | 6/1998 | Farkas et al. |
| 5,793,272 A | 8/1998 | Burghartz et al. |
| 5,795,215 A | 8/1998 | Guthrie et al. |
| 5,807,165 A | 9/1998 | Uzoh et al. |
| 5,840,629 A | 11/1998 | Carpio |
| 5,858,813 A | 1/1999 | Scherber et al. |
| 5,884,990 A | 3/1999 | Burghartz et al. |
| 5,897,375 A | 4/1999 | Watts et al. |
| 5,911,619 A | 6/1999 | Uzoh et al. |
| 5,922,091 A | 7/1999 | Tsai et al. |
| 5,930,669 A | 7/1999 | Uzoh |
| 5,933,753 A | 8/1999 | Simon et al. |
| 5,954,997 A | 9/1999 | Kaufman et al. |
| 5,985,123 A | 11/1999 | Koon |
| 6,004,880 A | 12/1999 | Liu et al. |
| 6,027,631 A | 2/2000 | Broadbent |
| 6,063,506 A | 5/2000 | Andricacos et al. |
| 6,066,030 A | 5/2000 | Uzoh |
| 6,071,388 A | 6/2000 | Uzoh |
| 6,074,544 A | 6/2000 | Reid et al. |
| 6,103,085 A | 8/2000 | Woo et al. |
| 6,106,378 A | 8/2000 | Perlov et al. |
| 6,113,759 A | 9/2000 | Uzoh |
| 6,132,587 A | 10/2000 | Jorne et al. |
| 6,136,163 A | 10/2000 | Cheung et al. |
| 6,176,992 B1 | 1/2001 | Talieh |
| 6,193,859 B1 | 2/2001 | Contolini et al. |
| 6,244,942 B1 | 6/2001 | Zuniga |
| 6,261,433 B1 * | 7/2001 | Landau .................. 205/96 |
| 6,297,155 B1 | 10/2001 | Simpson et al. |
| 6,299,741 B1 | 10/2001 | Sun et al. |
| 6,365,017 B1 * | 4/2002 | Hongo et al. ............ 204/212 |
| 2001/0017258 A1 | 8/2001 | Ishida et al. |
| 2001/0041526 A1 | 11/2001 | Perlov et al. |

OTHER PUBLICATIONS

Robet D. Mikkola et al., "Investigation of the Roles of the Additive Components for Second Generation Copper Electroplating Chemistries Used for Advanced Interconnect Metalization", 2000 IEEE, IEEE Electron Devices Society, pp. 117–119, no date.

James J. Kelly et al., "Leveling and Microstructural Effects of Additives for Copper Electrodeposition", Journal of the Electrochemical Society, 1999, pp. 2540–2545, No month.

* cited by examiner

ANODE DESIGNS FOR PLANAR METAL DEPOSITS WITH ENHANCED ELECTROLYTE SOLUTION BLENDING AND PROCESS OF SUPPLYING ELECTROLYTE SOLUTION USING SUCH DESIGNS

BACKGROUND OF THE INVENTION

This invention relates to an apparatus and a method to deposit, polish, or electro-polish metal films on a substrate, or to remove such metal films from such a substrate. The unique anode assembly is particularly suitable for providing planar metal deposits on damascene-type interconnect and packaging structures.

Multi-level integrated circuit manufacturing requires many steps of metal and insulator film depositions followed by photoresist patterning and etching or other means of material removal. After photolithography and etching, the resulting wafer or substrate surface is non-planar and contains many features such as vias, lines or channels. Often, these features need to be filled with a specific material, such as a metal, a dielectric, or both. For high performance applications, the wafer topographic surface needs to be planarized, making it ready again for the next level of processing, which commonly involves deposition of a material, and a photolithographic step. It is most preferred that the substrate surface be flat before the photolithographic step so that proper focusing and level-to-level registration or alignment can be achieved. Therefore, after each deposition step that yields a non-planar surface on the wafer, there is often a step of surface planarization.

Electrodeposition is a widely accepted technique used in IC manufacturing for the deposition of a highly conductive material such as copper (Cu) into the features such as vias and channels opened in an insulating layer on the semiconductor wafer surface.

Electrodeposition is commonly carried out cathodically in a specially formulated electrolyte solution containing copper ions as well as additives that control the texture, morphology and plating behavior of the copper layer. A proper electrical contact is made to the seed layer on the wafer surface, typically along the circumference of the round wafer. A consumable Cu or inert anode plate is placed in the electrolyte solution. Deposition of Cu on the wafer surface can then be initiated when a cathodic potential is applied to the wafer surface with respect to an anode, i.e., when a negative voltage is applied to the wafer surface with respect to an anode plate.

The importance of overcoming the various deficiencies of the conventional electrodeposition techniques is evidenced by technological developments directed to the deposition of planar copper layers. For example, U.S. Pat. No. 6,176,992 to Talieh, entitled METHOD AND APPARATUS FOR ELECTROCHEMICAL MECHANICAL DEPOSITION, commonly owned by the assignee of the present invention, describes in one aspect an electro chemical mechanical deposition technique (ECMD) that achieves deposition of the conductive material into the cavities on the substrate surface while minimizing deposition on the field regions by polishing the field regions with a pad as the conductive material is deposited, thus yielding planar copper deposits.

U.S. application Ser. No. 09/740,701 entitled PLATING METHOD AND APPARATUS THAT CREATES A DIFFERENTIAL BETWEEN ADDITIVE DISPOSED ON A TOP SURFACE AND A CAVITY SURFACE OF A WORKPIECE USING AN EXTERNAL INFLUENCE, now U.S. Pat. No. 6,534,116, also assigned to the same assignee as the present invention, describes in one aspect a method and apparatus for plating a conductive material onto the substrate by creating an external influence, such as causing relative movement between a workpiece and a mask, to cause a differential in additives to exist for a period of time between a top surface and a cavity surface of a workpiece. While the differential is maintained, power is applied between an anode and the substrate to cause greater relative plating of the cavity surface than the top surface.

U.S. application Ser. No. 09/735,546 entitled METHOD AND APPARATUS FOR MAKING ELECTRICAL CONTACT TO WAFER SURFACE FOR FULL-FACE ELECTROPLATING OR ELECTROPOLISHING, filed on Dec. 14, 2000, now U.S. Pat. No. 6,482,307, describes in one aspect a technique for providing full face electroplating or electropolishing. U.S. application Ser. No. 09/760,757, entitled METHOD AND APPARATUS FOR ELECTRODEPOSITION OF UNIFORM FILM WITH MINIMAL EDGE EXCLUSION ON SUBSTRATE, filed on Jan. 17, 2001, now U.S. Pat. No. 6,610,190, describes in one aspect a technique for forming a flat conductive layer on a semiconductor wafer surface without losing space on the surface for electrical contacts.

In such above-mentioned processes, a pad or a mask can be used during at least a portion of the electrodeposition process when there is physical contact between the workpiece surface and the pad or the mask. The physical contact or the external influence affects the growth of the metal by reducing the growth rate on the top surface while effectively increasing the growth rate within the features.

In a metal deposition process using a soluble anode, it is necessary to minimize contamination of the deposited metal with anode sludge or anode fines. Typically, an anode bag is wrapped around the soluble anode to minimize this sort of contamination. In a conventional manner of copper electrodeposition for interconnect or packaging applications, as shown in FIG. 1, an anode bag or filter 150 is wrapped around an anode 152. A suitable space separates the anode 152 from the cathode 154 in the deposition cell 156. Agitation, recirculation or even filtration of the electrolyte solution 160 may be provided. During routine plating operations, anode sludge builds up in the anode sludge cavity 158 formed by the space between the anode 152 and the bag 150. In the case of Cu plating, excessive anode sludge build-up affects the quality of the deposited metal on the cathode 154 in an adverse manner. In particular, the uniformity of the deposited metal becomes poorer because of changes in the electric field distribution. In addition, the plating voltage increases because of anode polarization. The copper ions are unable to diffuse fast enough through the sludge layer to meet the requirements of the cathode. Moreover, the resulting loss in plating efficiency may cause hydrogen to be plated or evolve at the cathode. For routine maintenance, the anode 152 is removed from the deposition cell 156 and cleaned or desludged before replacement.

A general depiction of a plating and planarization apparatus in which improved anode assemblies such as those of the present invention can be used is shown in FIG. 2. The carrier head 10 holds a round semiconductor wafer 16 and, at the same time, provides an electrical lead 7 connected to the conductive lower surface of the wafer. The head can be rotated about a first axis 10b. The head can also be moved in the x and y directions represented in FIG. 2. An arrangement which provides movement in the z direction may also be provided for the head.

Certain embodiments of a carrier head that may be used to hold the wafer 16 form the subject matter of co-pending U.S. patent application Ser. No. 09/472,523, titled WORK PIECE CARRIER HEAD FOR PLATING AND POLISHING, filed Dec. 27, 1999, now U.S. Pat. No. 6,612,915, the disclosure of which is incorporated herein by reference as non-essential subject matter. Certain embodiments of anode assemblies with anode bags which are useable in conjunction with such a carrier head form the subject matter of co-pending U.S. patent application Ser. No. 09/568,584, filed May 11, 2000, titled ANODE ASSEMBLY FOR PLATING AND PLANARIZING A CONDUCTIVE LAYER, now U.S. Pat. No. 6,478,936, the disclosure of which is also incorporated herein by reference as non-essential subject matter.

A pad 8 is provided on top of a round anode assembly 9 across from the wafer surface. The pad 8 may have designs or structures such as those forming the subject matter of co-pending U.S. patent application Ser. No. 09/511,278, titled PAD DESIGNS AND STRUCTURES FOR A VERSATILE MATERIALS PROCESSING APPARATUS, filed Feb. 23, 2000, now U.S. Pat. No. 6,413,388. The disclosure of this co-pending application is also incorporated by reference herein as non-essential subject matter. Co-pending U.S. patent application Ser. No. 09/621,969, titled PAD DESIGNS AND STRUCTURES WITH IMPROVED FLUID DISTRIBUTION, filed Jul. 21, 2000, now U.S. Pat. No. 6,413,403, also relates to such pad designs and structures. The disclosure of application Ser. No. 09/621,969 is also incorporated by reference herein as non-essential subject matter.

SUMMARY OF THE INVENTION

The anode assemblies which are about to be described have the ability to rotate at controlled speeds in both directions and the mechanical strength to support a pad against which the wafer surface can be pushed with controlled force. They have the capability of receiving, containing, delivering, and distributing process fluids. The assemblies can be used for an electrodeposition process, as well as for a plating and planarization process or an ECMD process. The assemblies may even be used in a CMP tool.

This invention provides further improved anode designs and assemblies meeting the requirements of high quality metal plating and deposition of super-planar films. The special attributes of these further improved anode designs and assemblies are discussed below.

In each embodiment of the invention, an anode assembly by which a solution can be supplied to a surface of a semiconductor substrate includes a housing defining an internal housing volume into which the solution can flow. Each assembly also has a closure for the internal housing volume through which the solution can be discharged from the volume towards the substrate surface. A filter, by which the internal housing volume can be divided into a first chamber and a second chamber, is located between the first chamber and the closure. When the solution is being supplied to the surface, a flow of the solution into the second chamber occurs at a higher rate than a flow of the solution into the first chamber, and the flows are blended in the second chamber.

The housing includes at least one primary flow channel, through which the solution can pass directly into the second chamber, and at least one secondary flow channel, through which the solution can pass directly into the first chamber. In one embodiment, the primary and secondary flow channels are independent of each other. In an alternative embodiment, the secondary flow channel taps into the primary flow channel, and the secondary flow channel is adapted to divert a portion of the solution which flows through the primary flow channel to the first chamber.

The closure for the internal housing volume is a plate which can cover the volume. A pad through which the solution can flow lies over the plate.

A second filter can be provided between the second chamber and the closure. The second filter can have smaller pores than the first filter by which the internal housing volume can be divided into the first and second chambers.

In one embodiment of the invention, a drain by which sludge can be removed from the first chamber is provided. In a modified construction, an external filter, which pre-filters the solution before it enters the housing, can be utilized. In this case, the housing mentioned above is an upper housing, and the assembly further includes a lower housing, to which the external filter can be mounted, adapted to receive at least part of the upper housing in a volume defined thereby. In this construction, a fluid inlet chamber is defined between the lower housing and the upper housing when the lower housing receives this part of the upper housing.

An anode, usually a soluble anode, is typically received within the first chamber. The solution used, moreover, is typically an electrolyte solution out of which a conductive film can be deposited onto the surface of the semiconductor substrate.

According to another aspect of the invention, a process of supplying a solution to a surface of the semiconductor substrate received in the anode assembly includes providing the housing which has an internal volume. This volume is divided by a filter into a first chamber and a second chamber located between the first chamber and the surface. The solution is supplied to the housing, and is then divided into one flow passing directly into the second chamber and another flow passing into the second chamber through the first chamber. The flows are blended together in the second chamber, and the solution is then discharged from the housing towards the surface.

According to yet another aspect of the invention, at least one orifice can be used to remove air bubbles in the first chamber, in the second chamber, or in both the first and second chambers. At least one orifice in the first chamber and at least one orifice in the second chamber could be used to de-bubble the solution or prevent air bubble accumulation in the anode assembly. Air bubble accumulation may be reduced by way of a controlled leak between flanges.

DESCRIPTION OF THE PREFERRED EMBODIMENTS

Each of the anode assemblies discussed below is particularly adapted to be used with a soluble, i.e. consumable, anode. However, it is contemplated that the anode assemblies could utilize or be utilized as inert anodes and that the anode assemblies could be used in etching applications as well as metal deposition applications.

Figure 1:
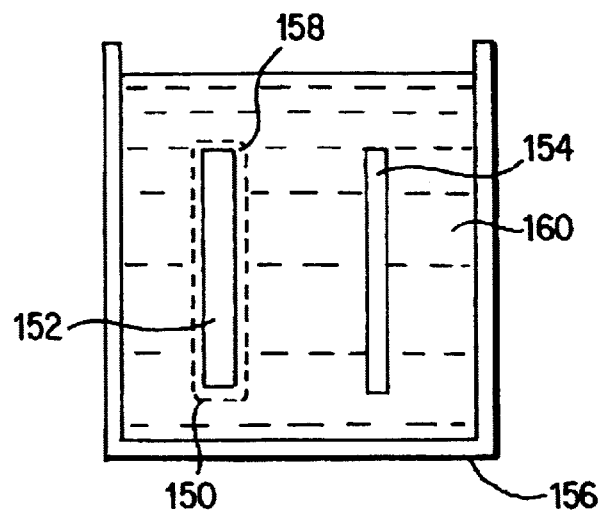
FIG. 1 illustrates a conventional conductive material electrodeposition apparatus.
Figure 2:
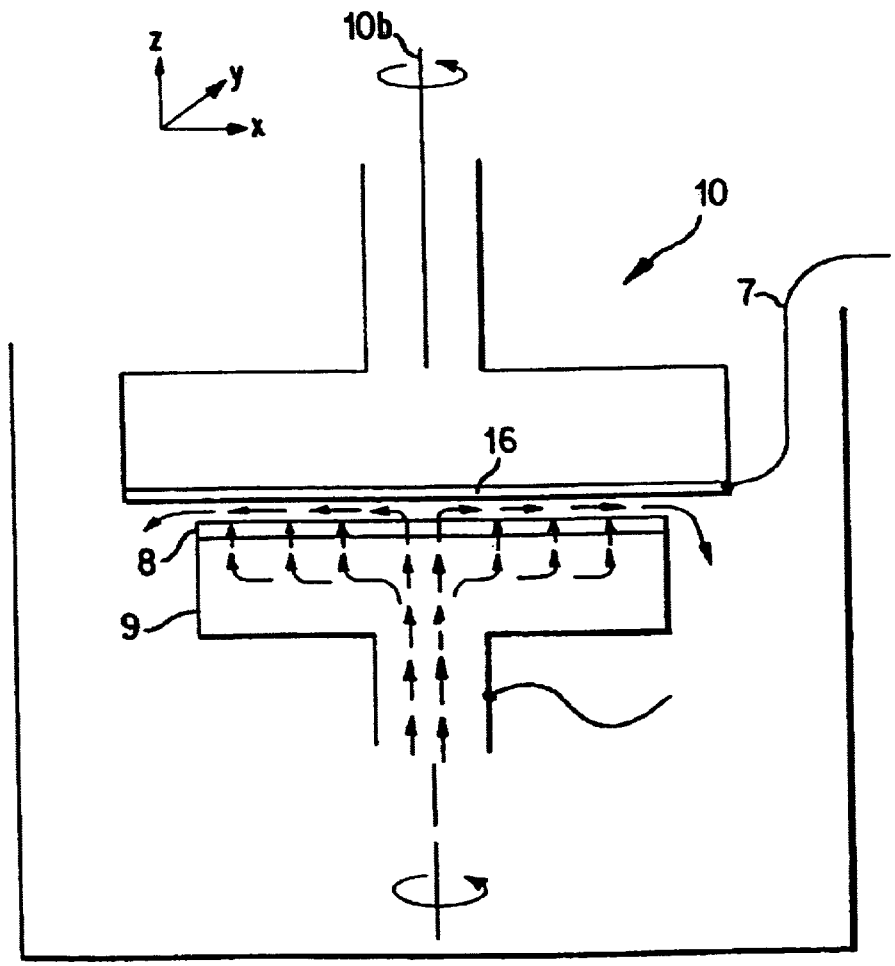
FIG. 2 is a schematic illustration of an overall apparatus in which an anode assembly according to the present invention can be used.
Figure 3:
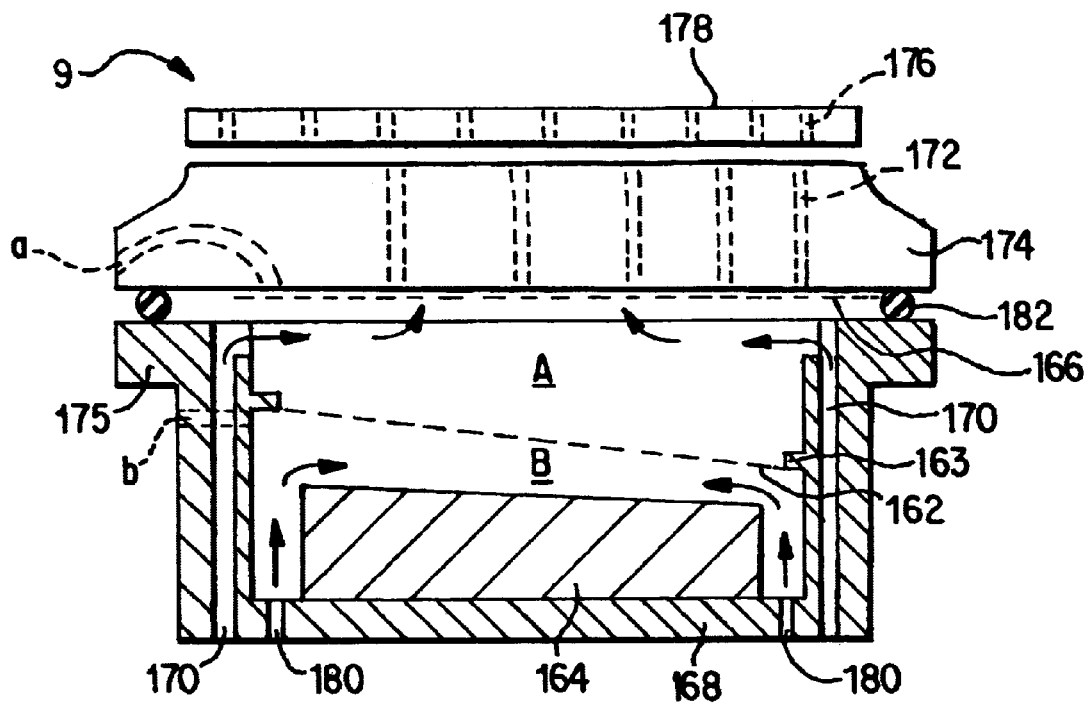
FIG. 3 is a schematic sectional view of an anode assembly according to the present invention in which a first anode housing embodiment is used.

According to the invention, multiple anode filters, disposed at several locations within the anode housing, are used. Filters with different pore sizes are provided. Filters can also be laminated between two porous sheets. FIG. 3 shows an anode assembly 9 with multiple filters and vertically configured primary and secondary fluid delivery channels. In this anode configuration, a primary anode filter 162 is disposed, by way of a filter mount 163, within the anode chamber and essentially isolates the anode 164 from the rest of the anode chamber. The primary anode filter 162 may, for example, consist of one or multiple layers of napped polypropylene cloth, or a polyethylene, polysulfone, hydrophilic PVDF, or PFTE filter, with a particle or pore size of less than 1.0 micron, average, in diameter. The filter 162 entombs anode sludge around the anode 164. Disposed away from the primary anode filter 162 is an upper anode filter 166. The pore size of the upper anode filter 166 is preferably between 30 microns and 0.1 micron in diameter. The upper anode filter 166 is secured in place in such a way that it is effective in filtering the electrolyte solution or fluid that communicates with the cathode.

A cavity A, within the anode housing 168, separates the primary anode filter element or elements 162 and the upper or secondary anode filter 166. The cavity or chamber A may be referred to as an inter-filter blending chamber. In this chamber A, the solution emanating from a lower anode chamber B blends or is mixed with solution from at least one primary flow channel 170. Together, the chambers A and B form an internal housing volume into which the electrolyte solution can flow. The filter 162 thus divides the internal housing volume into the lower anode chamber B and the inter-filter blending chamber A, which is located between the lower anode chamber and a top anode plate 174. In the embodiment illustrated in FIG. 3, and in each of the embodiments shown in FIGS. 4–6 which will be described, the blending of electrolyte solution in the chamber A and the higher velocity, or rate of flow, of the solution flowing from the primary flow channel enhance the migration of copper or other metal ions from the lower anode chamber B into the blending chamber A. This enhanced ion migration, in other words, is provided by the blending which occurs in the chamber A and because a flow of the electrolyte solution into the blending chamber A occurs at a higher rate than a flow of the solution into the anode chamber B. The dynamic mixing and migration reduce the copper ion concentration difference between the lower anode chamber B and the upper inter-filter blending chamber A, thus reducing cell polarization due to any large ion concentration differences in the cell.

The primary flow channel may be a vertical channel providing for electrolyte solution or fluid communication and can be incorporated into the anode housing. The primary and secondary flow channels can both be formed as apertures within the wall of the cell, as shown in FIG. 3. The primary flow channels 170 transfer the bulk of the solution, more than 60%, directly into the inter-filter blending chamber A. The solution is then filtered by the very fine upper anode filter 166, which has apertures that, typically, are less than 10.0 $\mu$m, and preferably 0.02–0.5 $\mu$m, in average diameter. The filtered solution then is transferred to the cathode via channels 172 in the anode top plate 174 and channels 176 in a pad or pad assembly 178. The top anode plate 174 forms a closure for the internal housing volume and is secured to a flange 175 defined at an upper end of the anode housing in any appropriate way such as, for example, by bolts. The solution can thus be discharged from the internal housing volume towards the surface of a semiconductor substrate through the channels 172 in the top plate 174 and through the channels 176 in the pad or pad assembly. An O-ring seal 182 may be provided between an underside of the top anode plate 174 and the flange 175 to prevent leakage of plating or plating/planarization solution. The O-ring may be omitted to allow for controlled fluid leakage between the flanges. Controlled leakage may be used to remove bubbles in the mixing chamber. The top anode plate 174 may have essentially the same construction as the pad support plate 22 of co-pending U.S. patent application Ser. No. 09/568,584 mentioned earlier, while the pad or pad assembly 178 may have essentially the same structure as the pad 8 of the same earlier mentioned application.

The secondary flow channels 180 convey the balance of the electrolyte into the lower anode chamber or space B surrounding the anode 164. The solution emanating from the lower anode chamber B is filtered by the primary anode filter 162 before entering and mixing with the solution in the inter-filter blending chamber A.

Figure 6:
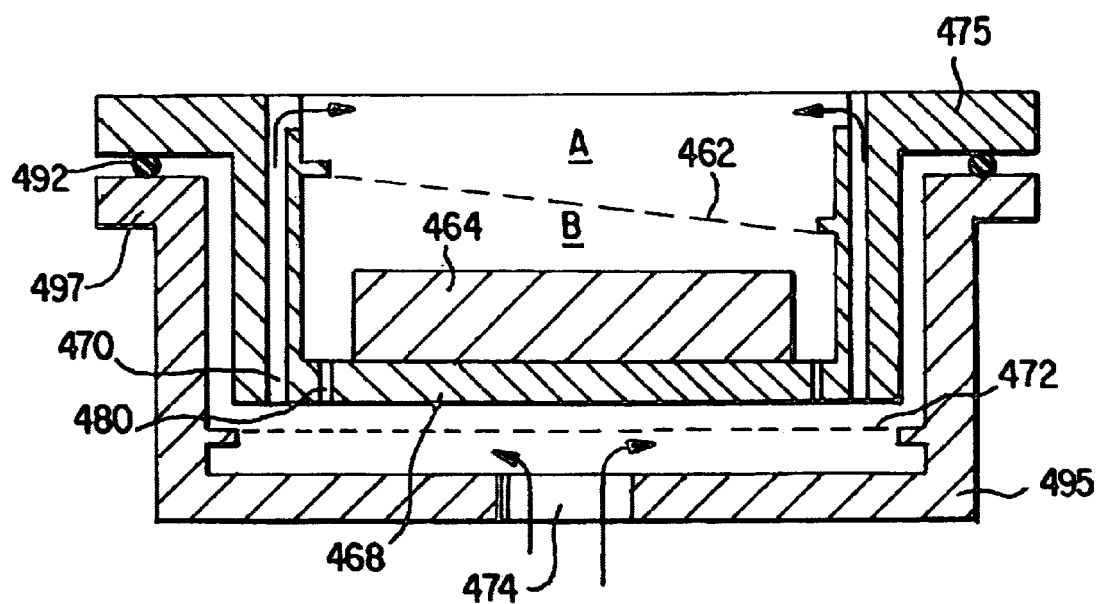
FIG. 6 is view similar to FIG. 3 but illustrating the provision of a pre-filtering arrangement which may be utilized.

In other cell configurations, another, external, filter, or a set of additional external filtering elements, may be provided. FIG. 6 shows one such cell configuration, in which an external filter 472 is disposed below an upper anode housing 468. This external or "inter-bowl" filter 472 may be used to pre-filter the electrolyte solution flowing in from a fluid inlet 474. The cell configuration of FIG. 6 also includes an anode 464 disposed in a lower anode chamber B which is separated from an inter-filter blending chamber A by a primary anode filter 462. As in the embodiment shown in FIG. 3, the primary anode filter 462 may consist of one or multiple layers of filters or a filter cartridge assembly with a particle or pore size between 1 and 5 microns in diameter. The primary anode filter 462 entombs anode sludge around the anode 464.

An upper anode filter (not shown in FIG. 6) is disposed away from the primary anode filter 462, and it is to be understood that a top anode plate (not shown in FIG. 6) is mounted to a flange 475 of upper anode bowl or housing 468, similar to the way in which the top anode plate 174 is mounted to the flange 175 in the embodiment shown in FIG. 3, thereby forming the inter-filter blending chamber A.

The upper anode bowl 468 includes primary flow channels 470 and secondary flow channels 480 having the same configurations and functions as the primary and secondary flow channels 170 and 180 shown in FIG. 3.

As mentioned above, the external or inter-bowl filter 472 is disposed below the upper anode housing 468. This external filter can be mounted, e.g. by an appropriate filter mount, to a lower anode housing or bowl 495, and pre-filters the solution before it passes into the chambers A and B. The lower anode housing or bowl 495 defines a flange 497 which is connected, e.g. by bolts, to the flange 475 of the upper anode bowl or housing 468. An additional o-ring seal 492 can be disposed between facing surfaces of the flanges 475 and 497 to provide sealing. In all other aspects, the anode configuration of FIG. 6 is constructed in the same way as that shown in FIG. 3.

Figure 5:
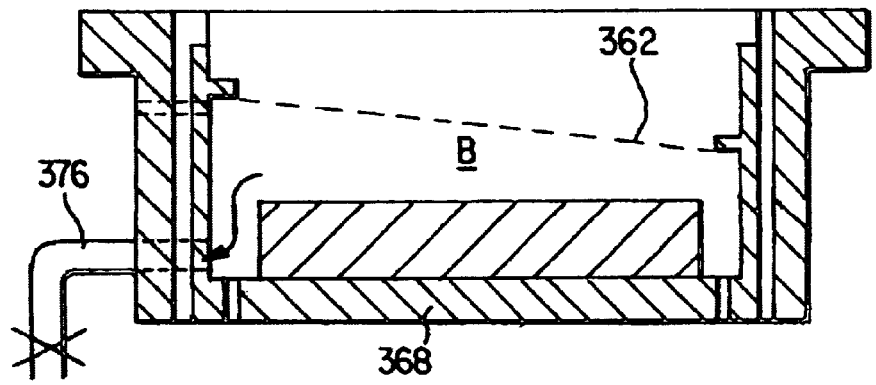
FIG. 5 is a schematic sectional view of a third anode housing embodiment which can be used in the anode assembly.

FIG. 5 illustrates the incorporation of an anode sludge drain 376 into another anode configuration. Anode sludge is drained, at routine intervals or as needed, through the opening provided by the anode sludge drain. Any practical device may be used to suck or evacuate the lower anode chamber B during routine wafer or workpiece processing or at any other suitable time. Thus, it is not necessary to disassemble the anode housing 368 and remove the primary anode filter 362 to de-sludge or clean the anode chamber B, as is typical in prior art operations. The in situ anode drain 376 improves plating cell utilization, because the need for routine anode service is eliminated. The in situ de-sludge operations also enhance the life of the lower anode filter.

In all other aspects, the anode configuration of FIG. 5 is constructed in the same way as that shown in FIG. 3.

Figure 4:
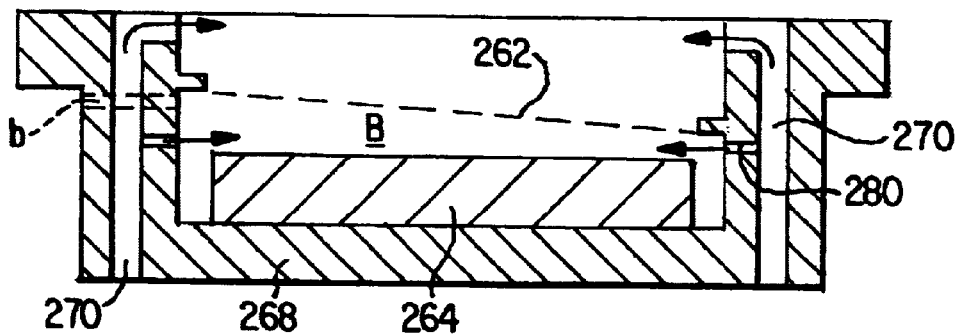
FIG. 4 is a schematic sectional view of a second anode housing embodiment which can be used in the anode assembly.

In other arrangements, the secondary flow to the lower anode chamber B may be tapped from the primary flow channel orifices as shown in FIG. 4. Here, apertures narrower than those of the primary flow channels 270 form the secondary flow channels 280 and are used to partition or divert a portion of the fluid in the primary channels 270 into the lower anode chamber B of the housing 268 surrounding the anode 264. In all other aspects, the anode configuration of FIG. 4 is constructed in the same way as that shown in FIG. 3.

Besides the flow channels described above, an additional small orifice (b), as indicated in FIGS. 3 and 4, or multiple additional orifices (not shown) may be provided to allow the electrolyte to leak out from the lower anode chamber B to the outside of the anode housing 168, 268, 368, or 468. At least one of these orifices is preferably provided to remove any bubbles that may be trapped between the anode upper surface and the primary anode filter. Similar air bleeder holes (a), as indicated in FIG. 3, may be incorporated in the top anode plate or in the upper walls of the anode housing. When the bleeder holes are absent, a de-gassing filtering element (not shown) may be used to de-gas the solution before the solution is transferred to the plating cell. For effective bubble removal, it is imperative that the filters 162, 262, 166, 462 and 362 be slanted or disposed at angles in the range of 1 to 30 degrees with respect to the horizon with the bleed hole disposed at the highest regions just below the filter.

In other operations, the lower anode chamber B may also be activated as needed to remove any large bubbles that may be trapped below the primary anode filter 162, 262, 362, or 462. The solution can be drained, filtered, and returned to the solution reservoir.

A similar draining arrangement may be incorporated in upper regions of the anode housing 168, 268, 368, or 468. This will be used to remove any large trapped air bubbles in chamber A, just beneath the upper anode filter.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

We claim:

1. An assembly by which a solution can be supplied to a surface of a substrate for electrochemical deposition and removal, comprising:

a housing defining an internal housing volume into which the solution can flow, a closure for said internal housing volume through which the solution can be discharged from said internal housing volume towards the surface of said substrate, and a filter by which said internal housing volume can be divided into a first chamber and a second chamber located between the first chamber and the closure, wherein, during supply of said solution to said surface, the solution flows through the filter, a flow of the solution into said second chamber occurs at a higher rate than a flow of the solution into said first chamber, and said flows are blended in said second chamber, wherein the filter is disposed so as to provide for effective removal of bubbles from the solution, and wherein said assembly includes at least one primary flow channel through which the solution can pass into said second chamber and at least one secondary flow channel through which the solution can pass into said first chamber.

2. The assembly of claim 1, wherein said housing includes said flow channels, said at least one primary flow channel can pass the solution directly into said second chamber, and said at least one secondary flow channel can pass the solution directly into said first chamber.

3. The assembly of claim 2, wherein said primary and secondary flow channels are independent of each other.

4. The assembly of claim 2, wherein said secondary flow channel taps into said primary flow channel.

5. The assembly of claim 4, wherein said secondary flow channel is adapted to divert a portion of the solution which flows through said primary flow channel to said first chamber.

6. The assembly of claim 1, wherein said closure is a plate which can cover said internal housing volume.

7. The assembly of claim 6, and further comprising a mask through which said solution can flow overlying said plate.

8. The assembly of claim 1, and further comprising a second filter which can be provided between said second chamber and said closure.

9. The assembly of claim 8, wherein the second filter is also disposed at an angle providing for effective removal of bubbles from the solution, and wherein at least one orifice is used to remove the bubbles from the second chamber.

10. The assembly of claim 1, wherein said substrate comprises a semiconductor wafer.

11. The assembly of claim 1, and further comprising an external filter which can pre-filter the solution before it enters the housing.

12. The assembly of claim 1, and further comprising an anode which can be received within said first chamber.

13. The assembly of claim 12, wherein said anode is a soluble anode.

14. The assembly of claim 12, wherein said anode is copper.

15. The assembly of claim 1, wherein said solution is an electrolyte solution out of which a conductive film can be deposited onto said surface of the substrate.

16. The assembly of claim 1, wherein at least one orifice is used to remove said bubbles from the first chamber.

17. The assembly of claim 1, and further comprising an electrode receivable within said first chamber.

18. An assembly by which a solution can be supplied to a surface of a substrate for electrochemical deposition and removal, comprising:

a housing defining an internal housing volume into which the solution can flow, a closure for said internal housing volume through which the solution can be discharged from said internal housing volume towards the surface of said substrate, a filter by which said internal housing volume can be divided into a first chamber and a second chamber located between the first chamber and the closure, and a drain by which sludge can be removed from said first chamber, wherein, during supply of said solution to said surface, a flow of the solution into said second chamber occurs at a higher rate than a flow of the solution into said first chamber, and said flows are blended in said second chamber.

19. An assembly by which a solution can be supplied to a surface of a substrate for electrochemical deposition and removal, comprising:

an upper housing defining an internal housing volume into which the solution can flow, a closure for said internal housing volume through which the solution can be discharged from said internal housing volume towards the surface of said substrate, a filter by which said internal housing volume can be divided into a first chamber and a second chamber located between the first chamber and the closure, an external filter which can pre-filter the solution before it enters the upper housing, and a lower housing, to which said external filter can be mounted, adapted to receive at least part of said upper housing in a volume defined thereby, wherein, during supply of said solution to said surface, a flow of the solution into said second chamber occurs at a higher rate than a flow of the solution into said first chamber, and said flows are blended in said second chamber.

20. The assembly of claim 19, wherein a fluid inlet chamber is defined between said lower housing and said upper housing when the lower housing receives said at least part of said upper housing.

21. An assembly by which a solution can be supplied to a surface of a substrate for electrochemical deposition and removal, comprising:

a housing defining an internal housing volume into which the solution can flow, a closure for said internal housing volume through which the solution can be discharged from said internal housing volume towards the surface of said substrate, and a filter by which said internal housing volume can be divided into a first chamber and a second chamber located between the first chamber and the closure, wherein, during supply of said solution to said surface, a flow of the solution into said second chamber occurs at a higher rate than a flow of the solution into said first chamber, and said flows are blended in said second chamber, and wherein at least one orifice opening to the first chamber and at least one orifice opening to the second chamber are used to de-bubble the solution or prevent air bubble accumulation in the anode assembly.

22. The assembly of claim 21, wherein the air bubble accumulation is reduced by way of a controlled leak between flanges.

23. A process of supplying a solution for electrochemical deposition and removal to a surface of a substrate received in an assembly comprising:

providing a housing having an internal volume divided by a filter disposed so as to provide for effective removal of bubbles from the solution into a first chamber and a second chamber located between the first chamber and said surface, supplying the solution to said housing, dividing the solution supplied to the housing into one flow passing through at least one primary flow channel directly into said second chamber and another flow passing through at least one secondary flow channel into said first chamber, through the filter, and into said second chamber, blending the flows together in said second chamber, and discharging said solution from said housing towards said surface.

24. The process of claim 23, wherein said solution is an electrolyte solution out of which a conductive film can be deposited onto said surface of the substrate.

25. The process of claim 23, wherein an anode is received within said first chamber.

26. The process of claim 25, wherein said anode is a soluble anode.

27. The process of claim 23, wherein at least one orifice is used to remove the bubbles from the first chamber.

28. The process of claim 23, wherein at least one orifice is used to remove bubbles from the second chamber.

29. The process of claim 23, wherein said substrate includes a semiconductor.

30. The process of claim 23, wherein the other flow is adapted to pass by an electrode receivable within said first chamber.

31. A process of supplying a solution for electrochemical deposition and removal to a surface of a substrate received in an assembly comprising:

providing a housing having an internal volume divided by a filter into a first chamber and a second chamber located between the first chamber and said surface, supplying the solution to said housing, dividing the solution supplied to the housing into one flow passing directly into said second chamber and another flow passing into said second chamber through said first chamber, blending the flows together in said second chamber, and discharging said solution from said housing towards said surface, wherein at least one orifice opening to the first chamber and at least one orifice opening to the second chamber are used to debubble the solution or prevent air bubble accumulation in the anode assembly.

32. The process of claim 31, wherein the air bubble accumulation is reduced by way of a controlled leak between flanges.

* * * * *